(12) United States Patent
Sogard

(10) Patent No.: US 7,598,508 B2
(45) Date of Patent: Oct. 6, 2009

(54) GASEOUS EXTREME-ULTRAVIOLET SPECTRAL PURITY FILTERS AND OPTICAL SYSTEMS COMPRISING SAME

(75) Inventor: Michael R. Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 415 days.

(21) Appl. No.: 11/339,119

(22) Filed: Jan. 23, 2006

(65) Prior Publication Data
US 2007/0012889 A1    Jan. 18, 2007

Related U.S. Application Data

(60) Provisional application No. 60/699,278, filed on Jul. 13, 2005.

(51) Int. Cl.
*A61N 5/06* (2006.01)
(52) U.S. Cl. .............. 250/504 R; 250/493.11; 250/503.1; 359/886; 359/358
(58) Field of Classification Search .. 250/493.1–504 H; 359/886, 358
See application file for complete search history.

(56) References Cited

U.S. PATENT DOCUMENTS

| | | | | |
|---|---|---|---|---|
| 5,786,893 | A * | 7/1998 | Fink et al. ................... | 356/301 |
| 6,396,056 | B1 * | 5/2002 | Lord et al. ................ | 250/252.1 |
| 7,196,343 | B2 * | 3/2007 | Van Herpen et al. ..... | 250/505.1 |
| 7,250,620 | B2 * | 7/2007 | Wurm et al. ............ | 250/504 R |
| 7,312,459 | B2 * | 12/2007 | Amemiya et al. ........... | 250/372 |
| 7,372,623 | B2 * | 5/2008 | Banine et al. ................ | 359/360 |
| 2003/0142280 | A1 * | 7/2003 | Bakker et al. ................. | 355/53 |
| 2005/0254029 | A1 * | 11/2005 | Banine et al. ................. | 355/53 |
| 2006/0145094 | A1 * | 7/2006 | Wilhelmus Van Herpen et al. ............................................ | 250/492.2 |
| 2006/0221440 | A1 * | 10/2006 | Banine et al. ............... | 359/359 |

OTHER PUBLICATIONS

Powell, "Care and feeding of soft x-ray and extreme ultraviolet filters," *Proceedings SPIE*, vol. 1848, pp. 503-514, 1992.
Powell, "Thin film filter performance for extreme ultraviolet and x-ray applications," *Optical Engineering*, vol. 29, No. 6, pp. 614-624, Jun. 1990.

* cited by examiner

*Primary Examiner*—David A Vanore
*Assistant Examiner*—Andrew Smyth
(74) *Attorney, Agent, or Firm*—Klarquist Sparkman, LLP

(57) ABSTRACT

Spectral-purity filters (SPFS) are disclosed that produce a stream of "SPF gas" through which a beam of light, particularly a beam including extreme ultraviolet (EUV) light, is allowed to pass. The SPF can be located in a system that receives a beam of EUV-containing light from a source and delivers the beam to a downstream EUV-optical system, wherein the beam from the source passes through the SPF to the optical system. The gaseous SPF is formulated and configured to enrich the beam in at least one EUV wavelength as the beam passes through the gaseous SPF. For enrichment of EUV wavelengths, an exemplary SPF gas is $ZrCl_4$. The stream of SPF gas can be sheathed in an inert "sheath gas." The gaseous SPF is usable in a vacuum environment, in which used SPF gas, and sheath gas if used, is collected.

30 Claims, 9 Drawing Sheets

GASEOUS EXTREME-ULTRAVIOLET SPECTRAL PURITY FILTERS AND OPTICAL SYSTEMS COMPRISING SAME

CROSS REFERENCE TO RELATED APPLICATIONS

This application claims priority from U.S. Provisional Application No. 60/699,278, filed Jul. 13, 2005, which is incorporated herein by reference in its entirety.

FIELD

This disclosure pertains to, inter alia, sources of extreme ultraviolet (EUV) light and to exposure systems including or otherwise associated with such sources. The subject exposure systems include, but are not limited to, lithography systems as used for fabricating microelectronic devices such as integrated circuits and displays. More specifically, the disclosure pertains to optical filters, termed spectral-purity filters, that are used in such sources and optical systems for reducing downstream propagation of out-of-band radiation from an EUV source.

BACKGROUND

Among several candidate "next-generation lithography" technologies for use in the manufacture of semiconductor integrated-circuit devices, displays, and other highly miniaturized devices is "extreme ultraviolet lithography" (EUVL). EUVL is lithography performed using a wavelength of electromagnetic radiation in the range of 11 to 14 nm, which is within the "extreme ultraviolet" or "soft X-ray" portion of the electromagnetic spectrum. EUVL offers prospects of greater image resolution than are currently obtainable using "optical" lithography, of which the shortest wavelengths currently in use are in the range of 150-250 nm.

A current challenge in the development of a practical EUVL system is providing a convenient source of EUV exposure "light" capable of providing an EUV beam at sufficient intensity at the desired wavelength for making lithographic exposures at an acceptable throughput. The most powerful source of EUV light currently available is synchrotron radiation. Unfortunately, very few fabrication plants at which EUVL would be performed have access to a synchrotron, which is extremely large and extremely expensive to install and operate. As a result, substantial research and development effort is currently being directed to the development of alternative sources of EUV light. The two principal approaches in this development involve the production of a plasma of a target material, wherein the plasma produces EUV radiation. In one method the plasma is produced by electrical discharge in the vicinity of the target material, and in the other method the plasma is produced by laser irradiation of the target material. The EUV radiation produced by both methods is pulsed. Whereas these methods have advantages of portability as well as relatively compact size and low cost of operation (especially relative to a synchrotron), they have several disadvantages. One disadvantage is the difficulty of producing a sufficiently intense beam of EUV light at the desired wavelength for desired high-throughput exposures. Another disadvantage is that the respective plasmas produced by these sources tend to generate gases and fine debris that deposit on nearby components, especially nearby optical components. In view of the extremely high performance demanded of EUV-optical elements, significant contamination of them by debris and gases from the EUV source simply cannot be tolerated.

Because no materials are known that are sufficiently transmissive and refractive to EUV light to serve as EUV lenses, EUV optics comprise reflective optical elements (i.e., mirrors). Except for grazing-incidence mirrors, all EUV mirrors have a respective surficial multilayer film that provides the mirror surfaces with a useful reflectivity to incident EUV light. For EUVL, these mirrors must be fabricated to extremely demanding tolerances and must exhibit extremely high optical performance.

Since EUV light is greatly attenuated and scattered by the atmosphere, the propagation pathway for EUV radiation in an EUVL system is evacuated to a vacuum. This requires that the EUVL optics (e.g., illumination optics and projection optics) be contained in at least one vacuum chamber that is evacuated to a desired vacuum level. Similarly, a plasma EUV source as summarized above is contained in a vacuum chamber (termed an "EUV-source chamber") that is evacuated to a desired vacuum level. Hence, EUV light generated in the plasma EUV source must propagate from the EUV-source chamber to the chamber containing the EUVL optics.

In the plasma EUV source, EUV light and other wavelengths of light produced by the plasma are collected into a beam. Light collection can be achieved using, for example, one or more collector mirrors situated near the plasma. From the collector mirror(s), the beam passes through the intermediate focus plane of the collector mirror(s), between the source and downstream EUV optics. From the intermediate focus plane the beam is directed as an "illumination beam" to an illumination unit ("illumination-optical system") contained in an illumination-unit chamber. The illumination-optical system, which is part of the EUVL optics, comprises various mirrors that collectively direct, shape, and condition the illumination beam as required for illumination of a pattern-defining reticle or other "pattern master" situated downstream of the illumination-optical system. Along this beam path the beam passes through a spectral purity filter (SPF). The SPF may be located near the intermediate focus plane, or it may be located within the illumination-optical system.

The SPF is utilized because the beam collected from the plasma contains various wavelengths of EUV radiation as well as longer wavelengths of electromagnetic radiation such as infrared light, ultraviolet light, and visible light. Wavelengths other than the desired EUV wavelength are termed "out-of-band" wavelengths that, if not removed, can cause various problems including an undesirable amount of heating of the EUV optics, the reticle, the photoresist on the lithographic substrate (e.g., wafer), and the lithographic substrate itself. Although most of the EUV radiation that is produced by the plasma and that is outside the specified EUV exposure bandwidth would be absorbed by the mirrors of the illumination-optical system, extraneous wavelengths of EUV light can cause exposure problems such as image blurring. Consequently, for exposure the EUV light desirably is substantially limited to the specified wavelength. Further blurring of the image in the photoresist can occur from out-of-band deep ultraviolet (DUV) radiation that can expose the photoresist as well.

A conventional SPF is configured (see details in next paragraph below) so as to block as much of the out-of-band wavelengths as possible, including longer wavelengths (IR, UV, visible) of light and unwanted wavelengths of EUV radiation. Also, if interposed between the plasma and the illumination-optical system, the SPF serves as a physical barrier that at least slows down the rate at which debris and gases from the plasma migrate to the illumination-unit chamber and beyond. Thus, the SPF helps prevent at least some of the gases and debris from contaminating, degrading, or otherwise damaging the EUV-optical elements of the illumination-optical system. Also, because the SPF blocks longer wavelengths of radiation, it reduces heating of EUV-optical elements located downstream of the SPF, and thus reduces thermal deformation of the downstream EUV-optical elements, thereby improving their imaging performance. But, because EUV transmission through a conventional SPF decreases with increasing thickness of the SPF, the SPF must be very thin to provide adequate transmission of the desired EUV wavelength.

The conventional SPF is an approximately 100-nm thick foil of zirconium (Zr); the foil is produced by vacuum deposition and gently laid onto and bonded to a supporting mesh of wires (e.g., nickel). See, e.g., Powell, "Care and Feeding of Soft X-ray and Extreme Ultraviolet Filters," *Proceedings SPIE* 1848:503, 1992; Powell et al., "Thin Film Filter Performance for Extreme Ultraviolet and X-ray Applications," *Optical Engineering* 29(6):614, 1990. Other candidate materials for the foil are niobium (Nb), ytterbium (Y), and silicon (Si), but these materials are less favored. Si exhibits good transmission at 13.4 nm (0.84 for a 100-nm thick film), but the transmission through this material also is high for other EUV wavelengths, so it does not exhibit much discriminatory filtering. Nb exhibits lower transmission at 13.4 nm than Si, and Y has problems with oxidation (as does Zr).

Conventional SPFs also have other disadvantages. First, although the Zr foil is very thin, it still absorbs approximately 30% of the incident 13.4-nm EUV radiation. No practical way has been found to make the Zr foil significantly thinner (to increase desired EUV transmission), especially without seriously compromising its mechanical integrity. Second, a conventional SPF is extremely fragile. Increasing its strength and durability by increasing the thickness of the Zr foil is not practical because increased foil thickness blocks even more incident EUV transmission. Third, the wire mesh must be coarse to minimize absorption by the mesh of a substantial fraction of the incident EUV radiation. As a result, much of the Zr foil (spanning open regions of the mesh) is only weakly supported. Fourth, since a substantial fraction of the radiation produced by the plasma is out-of-band, the SPF may have to absorb a large amount of power, which causes substantial heating of and possible damage to the SPF. Fifth, depending upon the nature of any debris-mitigation system upstream of it, the SPF may be vulnerable to erosion or deposition damage as well as additional heating from particles emitted from the plasma. Sixth, while it is advantageous to locate the SPF near the intermediate focus plane, the intense plasma and radiation intensities produced in commercial EUV lithography tools are likely to damage the SPF quickly. Seventh, the opaque supporting mesh of the SPF limits location of the SPF to regions of the illumination-optical system where the mesh is substantially out of focus at the reticle plane. Otherwise, the mesh would affect the EUV illumination uniformity at the reticle and thus at the wafer, creating imaging problems.

Whereas the conventional SPF summarized above has utility in the laboratory-scale EUVL systems developed to date, which have been operated with relatively low-intensity EUV beams, conventional SPFs may fail when subjected to the substantially higher-power EUV beam produced in the near future by a commercial-scale EUVL system. Thus, there is a need for SPFs that do not have the many disadvantages of conventional SPFs.

SUMMARY

The foregoing needs are met by, inter alia, gaseous spectral-purity filters (SPFs) and by optical systems including such SPFs, within the scope of the instant disclosure. A first aspect is set forth in the context of a system that receives a beam of light from a source and delivers the beam to a downstream optical system. A gaseous SPF is associated with the system, wherein the beam from the source passes through the gaseous SPF as the beam propagates to the optical system. The gaseous SPF is formulated and configured to enrich the beam in at least one desired wavelength as the beam passes through the gaseous SPF. The source and optical system can be situated in a subatmospheric-pressure ("vacuum") environment, wherein the gaseous SPF is configured as a stream of SPF gas flowing in the subatmospheric-pressure environment.

In a more specific embodiment, the system receives a beam of EUV-containing light from a source and delivers the beam to a downstream EUV-optical system. In this embodiment the gaseous SPF is formulated and configured to enrich the beam in at least one desired EUV wavelength as the beam passes through the gaseous SPF.

In an embodiment the gaseous SPF comprises a first gas-discharge device and a stream of SPF gas discharged from the first gas-discharge device. An exemplary first gas-discharge device is a nozzle. The stream of SPF gas can be delivered as a supersonic stream in a subatmospheric-pressure environment. By way of example, for use with EUV light, the stream of SPF gas can comprise $ZrCl_4$ gas, $B_5H_{11}$ gas, or a mixture thereof. If the SPF gas is $ZrCl_4$, the first gas-discharge device can be connected to a source of $ZrCl_4$ liquid, wherein the first gas-discharge device comprises means for converting the $ZrCl_4$ liquid to a gas before the gas is discharged from the first gas-discharge device.

The gaseous SPF can further comprise a second gas-discharge device, situated relative to the first gas-discharge device, and a stream of sheath gas discharged from the second gas-discharge device so as to envelope the stream of SPF gas. The stream of sheath gas desirably comprises an inert gas that is transmissive to the desired EUV wavelength.

Yet another embodiment comprises a gas-discharge assembly that comprises a first gas-discharge device (e.g., a nozzle) that is connected to a supply of an SPF gas and configured to discharge a stream of the SPF gas such that the beam is incident on the stream in a manner allowing at least a portion of the beam to pass through the stream. This embodiment can further comprise a gas-collection assembly that is situated relative to the gas-discharge assembly and the beam, wherein the gas-collection assembly is configured to collect the SPF gas from the stream through which the beam has passed. The gas-discharge assembly can further comprise a second gas-discharge device (e.g., a nozzle) surrounding the first gas-discharge device, wherein the second gas-discharge device is connected to a supply of a sheath gas comprising an inert gas that is transmissive to the desired EUV wavelength. The second gas-discharge device in this embodiment is configured to discharge a stream of the sheath gas that envelopes the stream of SPF gas. If a gas-collection assembly is included, it can be configured to collect the SPF gas and the sheath gas from the stream through which the beam has passed.

According to another aspect, EUV optical systems are provided. An embodiment of such a system comprises an optical system and a gaseous SPF. The optical system is situated and configured to receive a beam of EUV light from a source. The gaseous SPF is situated between the source and the optical system, or within the optical system, such that the beam passes through the SPF as the beam propagates from the source through the optical system. The gaseous SPF serves to enrich the beam, downstream of the SPF compared to upstream of the SPF, in a desired EUV wavelength as the beam passes through the gaseous SPF. The gaseous SPF can comprise a first gas-discharge means and a stream of SPF gas discharged from the first gas-discharge means. The gaseous SPF further can comprise a second gas-discharge means that is situated relative to the first gas-discharge means, and a stream of sheath gas discharged from the second gas-discharge means so as to envelope the stream of SPF gas.

In another embodiment of an EUV optical system the gaseous SPF comprises a gas-discharge portion that is connected to a supply of an SPF gas and configured to discharge a stream of the SPF gas such that the beam from the source is incident on the stream in a manner allowing the beam to pass through the stream to the optical system. The embodiment also can include a gas-collection portion that is situated relative to the gas-discharge portion and the beam and that is configured to collect the SPF gas from the stream through which the beam has passed. The gas-discharge portion can comprise a first nozzle that is connected to the supply of SPF gas and that is configured to discharge the stream of SPF gas, and a second nozzle surrounding the first nozzle, wherein the second nozzle is connected to a supply of a sheath gas. The second nozzle is configured to discharge a stream of the sheath gas that envelopes the stream of SPF gas through which the beam passes. The gaseous SPF further can comprise a gas-collection portion that is situated relative to the gas-discharge portion and the beam, and that is configured to collect the SPF gas and the sheath gas from the stream through which the beam has passed.

Yet another embodiment of an EUV optical system comprises an optical system that is situated and configured to receive a beam of EUV light from a source, and a first SPF that is situated between the source and the optical system, or within the optical system. The first SPF is a gaseous SPF. The EUV optical system also comprises a second SPF situated downstream of the first SPF. The beam passes through the first and second SPFs as the beam propagates from the source through the optical system. The first and second SPFs serve to enrich the beam, downstream of the SPFs compared to upstream of the SPFs, in a desired EUV wavelength as the beam passes through the first and second SPFs. By way of example, the second SPF can comprise a film of Zr supported on a mesh, in the manner of a conventional SPF.

According to another aspect, gaseous SPF apparatus are provided for placement between an EUV source and an optical element. An embodiment of such a gaseous SPF apparatus comprises a gas-discharge portion that is situated and configured to release a stream of SPF gas into a propagation pathway of a beam of EUV light from the EUV source. The beam from the EUV source passes through the stream of SPF gas to the optical element, and the SPF gas is transmissive for a desired wavelength of EUV light in the beam while blocking at least some other wavelengths in the beam. The gaseous SPF apparatus also comprises a gas-collection portion that is situated relative to the gas- discharge portion and configured to collect the SPF gas from the stream after the beam has passed through the stream of SPF gas.

As summarized above, the gas-discharge portion can comprise a nozzle assembly from which the stream of SPF gas is discharged. The nozzle assembly can comprise an SPF-gas-discharge nozzle and a sheath-gas-discharge nozzle, wherein the sheath-gas-discharge nozzle is configured to release a stream of sheath gas as the SPF-gas-discharge nozzle releases the stream of SPF gas. The sheath-gas-discharge nozzle can be configured to surround the SPF-gas-discharge nozzle such that the released stream of SPF gas is enveloped in the stream of sheath gas.

According to yet another aspect, illumination-optical systems for EUV lithography are provided. An embodiment of such a system comprises an EUV source that is situated and configured to produce a beam of EUV-containing light. A first EUV-reflective optical element is situated downstream of the EUV source, and a gaseous SPF is situated between the EUV source and the first EUV-reflective optical element. The gaseous SPF is configured to produce a stream of SPF gas through which the beam from the EUV source passes as the beam propagates to the first EUV-reflective optical element. The gaseous SPF is formulated and configured to enrich the beam in at least one desired EUV wavelength as the beam passes through the SPF. The system can include a second EUV-reflective optical element situated between the EUV source and the first EUV-reflective optical element.

According to yet another aspect, EUV lithography systems are provided. An embodiment of such a system comprises an illumination-optical system situated and configured to receive a beam of EUV light from a source and to direct the beam for lithographic imaging. A gaseous SPF is situated either between the source and the illumination-optical system or within the illumination-optical system. The gaseous SPF is configured to produce a stream of SPF gas through which the beam passes. The gaseous SPF is formulated and configured to enrich the beam in at least one desired EUV wavelength as the beam passes through the SPF.

According to yet another aspect, sources of EUV light are provided. An embodiment of the source comprises a generating device that generates EUV-containing light, and a gaseous SPF situated downstream of the generating device. The gaseous SPF is configured to produce a stream of SPF gas through which the EUV-containing light passes as the EUV-containing light propagates downstream of the generating device. The gaseous SPF is formulated and configured to enrich the EUV-containing light in at least one desired EUV wavelength as the light passes through the SPF. The source further can comprise a collector situated relative to the generating device and configured to collect at least some of the EUV-containing light into a beam that is directed by the collector to the stream of SPF gas. The generating device can be, for example, a laser-plasma source or a discharge-plasma source.

According to yet another aspect, methods are provided for producing a beam of EUV light that is enriched with respect to a desired wavelength of EUV radiation. An embodiment of such a method comprises producing a beam of electromagnetic radiation comprising EUV light, and passing the beam through a gaseous SPF that is relatively transmissive to a desired wavelength of EUV radiation and relatively non-transmissive to an undesired wavelength of electromagnetic radiation.

The foregoing and additional features and advantages of the invention will become more readily apparent from the following detailed description, which proceeds with reference to the accompanying drawings.

DETAILED DESCRIPTION

Basic Considerations

A gaseous SPF offers several advantages over a conventional "solid" SPF. Namely, a gaseous SPF can be continuously replenished, which eliminates concern about the SPF melting, burning up, or otherwise being destroyed and rendered non-functional by incident radiation. Even limited damage to a conventional SPF can change the filter's properties, leading to drifts in the amount of EUV or out-of-band radiation being delivered downstream of the SPF. The transmission properties of the gaseous SPF, in contrast to the conventional SPF, can be adjusted to some extent by varying gas pressure or gas type, to allow adjustment of EUV intensity at the reticle.

Desirably, the gas that is selected for use as an SPF exhibits EUV-transmission behavior at least as good as the currently best "solid" SPF materials. The currently most-used "solid" SPF material is Zr. Hence, it would appear that Zr gas would be an attractive candidate. Unfortunately, however, Zr is a refractory metal that has very high melting and boiling temperatures and hence would not be, and could not be, maintained as a gas under actual conditions of use of SPFs. Other currently used "solid" SPF materials are Nb and Y; but, these metals are also refractory and pose the same challenges as Zr.

Zr does form various halides that have relatively low melting points and that produce substantial vapor pressures at temperatures of several hundred degrees C. The only Zr halide that exhibits appreciable EUV transmission is $ZrCl_4$. Nb and Y also form halides (e.g., $NbCl_5$, $YCl_3$). In addition to these metal compounds, a number of boron hydrides ("boranes"; $B_nH_m$) exhibit desirable EUV-transmission properties and are gaseous at or near room temperature. The currently most suitable borane is $B_5H_{11}$. Other boranes either have inferior vapor-pressure properties or are poisonous.

Figure 1:
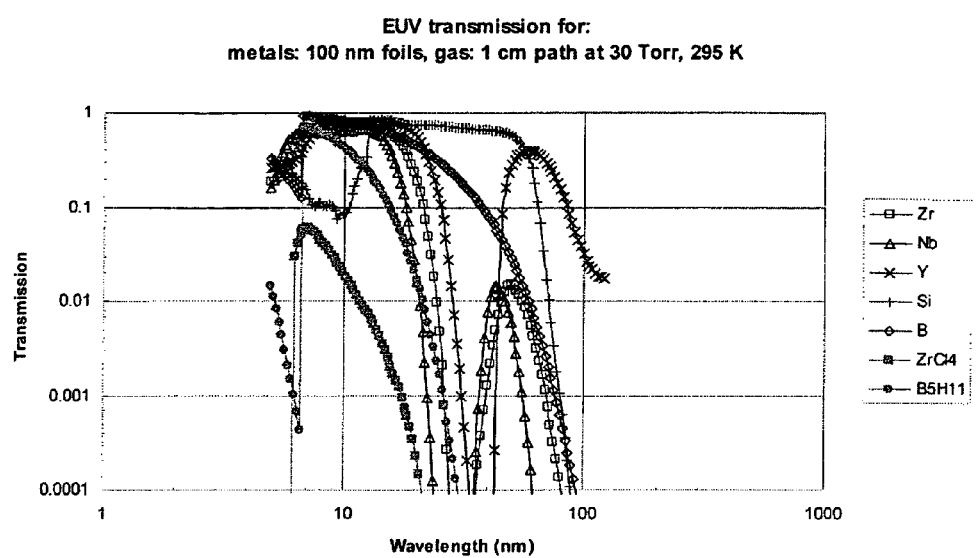
FIG. 1 is a plot of EUV transmission versus wavelength as exhibited by various materials, including gases, usable as EUV SPFs.

FIG. 1 summarizes the EUV spectral properties of certain materials. The plotted data were obtained from the website for the Lawrence Berkeley Laboratory Center for X-ray Optics. In FIG. 1 the transmission at 13.4 nm is rather low for the gaseous compounds $ZrCl_4$ and $B_5H_{11}$, but transmission can be changed by adjusting the pressure and temperature of the gas or the effective thickness of the gas layer. In any event, the pressure and temperature must lie on the vapor-pressure curve for the compound. The vapor-pressure curve describes the partial pressure of the vapor above the surface of the compound at a given pressure. The transmission t through a gas of thickness d is given by the expression:

$$t=\exp[-n\mu d] \quad (1)$$

where $\mu$ is the absorption cross-section of the gas and is a function of wavelength, and n is the number density of atoms or molecules of the compound. Assuming the gas obeys the ideal gas law, $$n=N/V=p/kT \quad (2)$$

where k is the Boltzmann constant ($1.3807 \times 10^{-23}$ J/K). For a desired transmission at, for example, 13.4 nm, Equations (1) and (2) can be combined to yield:

$$p/kT=n=-(1/\mu d)\ln[t] \quad (3)$$

If the transmission $t_1$ is already known at a given value of $P_1$ and $T_1$ (e.g., 30 Torr and 295 K, for a path length through the gas of 1 cm, in FIG. 1), the pressure $P_2$ and temperature $T_2$ for a transmission $t_2$ can be obtained in a manner that does not explicitly involve the absorption cross-section:

$$P_2/T_2=(P_1/T_1)(\ln[t_2]/\ln[t_1]) \quad (4)$$

Using this relation derived from the ideal gas law, the respective pressure-temperature curves for transmissions of t=0.9 and t=0.99 were calculated. Plotting these curves on the respective vapor-pressure curves for $ZrCl_4$ and $B_5H_{11}$ yielded the corresponding operating conditions for the gases, shown in FIG. 2.

Figure 2:
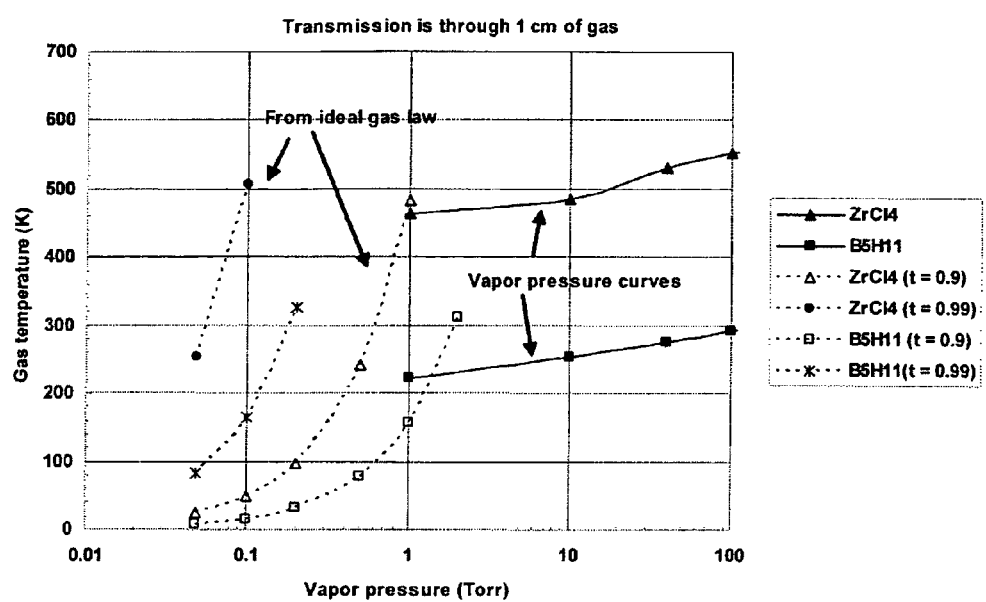
FIG. 2 is a plot, based on the ideal gas law, of respective pressure-temperature curves for $ZrCl_4$ and $B_5H_{11}$ for transmissions of t=0.9 and t=0.99, wherein the plots reveal corresponding operating conditions for these gases.

In FIG. 2 the intersection of a vapor-pressure curve with the respective ideal-gas-law curve reveals a possible operating point for a given transmission. For example, $ZrCl_4$ can have a transmission of t=0.9 (at 13.4 nm) for P≈0.95 Torr (≈127 Pa) and T≈460 K (≈187 C). Similarly, $B_5H_{11}$ has a transmission of 0.9 for P≈1.45 Torr and T≈226 K (−47 C). The lowest vapor pressure for which data appears to be available is 1 Torr, so extrapolation is required to obtain data for pressures lower than 1 Torr. Approximate values for several transmissions are summarized in Table 1.

TABLE 1

| Gas | Transmission | Pressure (Torr) | Temperature (K) |
| --- | --- | --- | --- |
| $B_5H_{11}$ | 0.9 | 1.45 (193 Pa) | 226 |
| $B_5H_{11}$ | 0.99 | 0.12 (16 Pa) | 195 |
| $ZrCl_4$ | 0.9 | 0.95 (127 Pa) | 460 |
| $ZrCl_4$ | 0.99 | 0.081 (10.8 Pa) | 442 |

Figure 3:
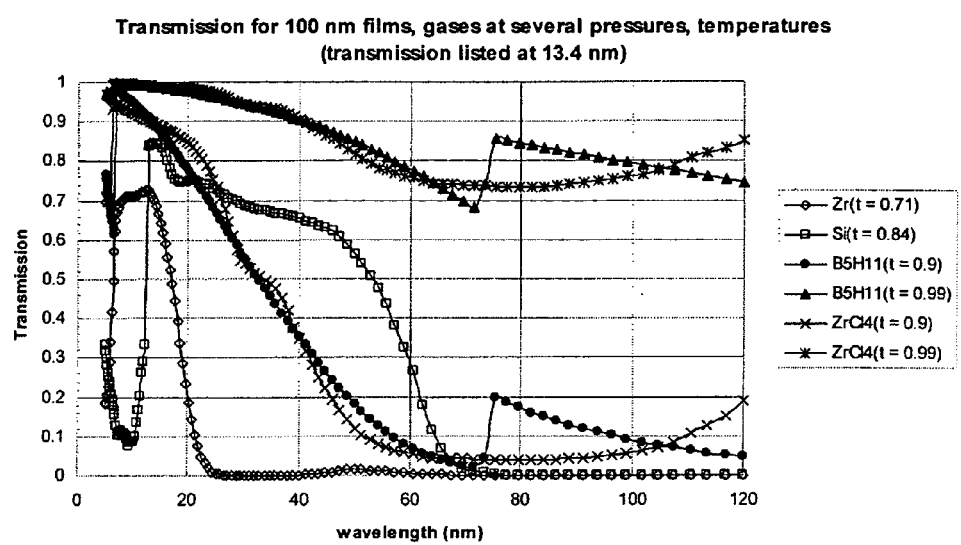
FIG. 3 includes graphs of transmission versus wavelength for 100-nm thick Zr, Si, $ZrCl_4$, and $B_5H_{11}$ for 100-nm films.

Settings for other transmissions can be obtained using Equation (4). The transmission properties of these gases are compared to Zr and Si in FIG. 3.

The transmissions of the gases at other EUV wavelengths may be too high for t=0.99 at 13.4 nm, but the transmissions for t=0.9 curves compare favorably to Zr and may be superior to Si. In comparing the transmissions of gaseous SPFs with the thin films of conventional SPFs in FIG. 1, it should be remembered that the effective transmission of the films is reduced by their supporting mesh.

The use of $ZrCl_4$ requires a heated source, while use of $B_5H_{11}$ requires a cryogenic source. If the reactivity of the SPF gas raises concern, it can be enclosed, as it is being discharged, in a gas sheath, wherein the outer (sheath) gas is non-reactive and transparent to EUV. Exemplary sheath gases are He and Ar.

The SPF gas (including sheath gas, if indicated) desirably is discharged as a supersonic jet into the vacuum chamber. This manner of discharge minimizes transverse spreading of the gas and allows maintenance of a relatively low pressure in the vacuum chamber. The pressure in the EUV source may be reduced further simply by increasing the length of the gaseous region along the propagation direction of the EUV radiation.

For example, extending the length from 1 cm to 2 cm reduces the required gas pressure by a factor of two. The absence of opaque structures, such as a supporting mesh, in the gaseous SPF allows more general placement of the gaseous SPF in the illumination-optical system. Furthermore, since the gas is constantly replenished, a gaseous SPF can be placed at or near the intermediate focus plane for even a very intense plasma source, without damage or degradation of its performance.

The gaseous SPF functions well in limiting out-of-band EUV radiation. However, its ability to limit transmission of DUV radiation is not fully known, and the SPF is likely to exhibit little attenuation of visible or infrared light. Hence, it may be advantageous to combine a gaseous SPF, located near the intermediate focus plane, with a very thin conventional SPF located further downstream of the EUV source, where the intensity of radiation has been reduced to a safe level.

Representative Embodiments of Gaseous SPF Apparatus

Figure 4A:
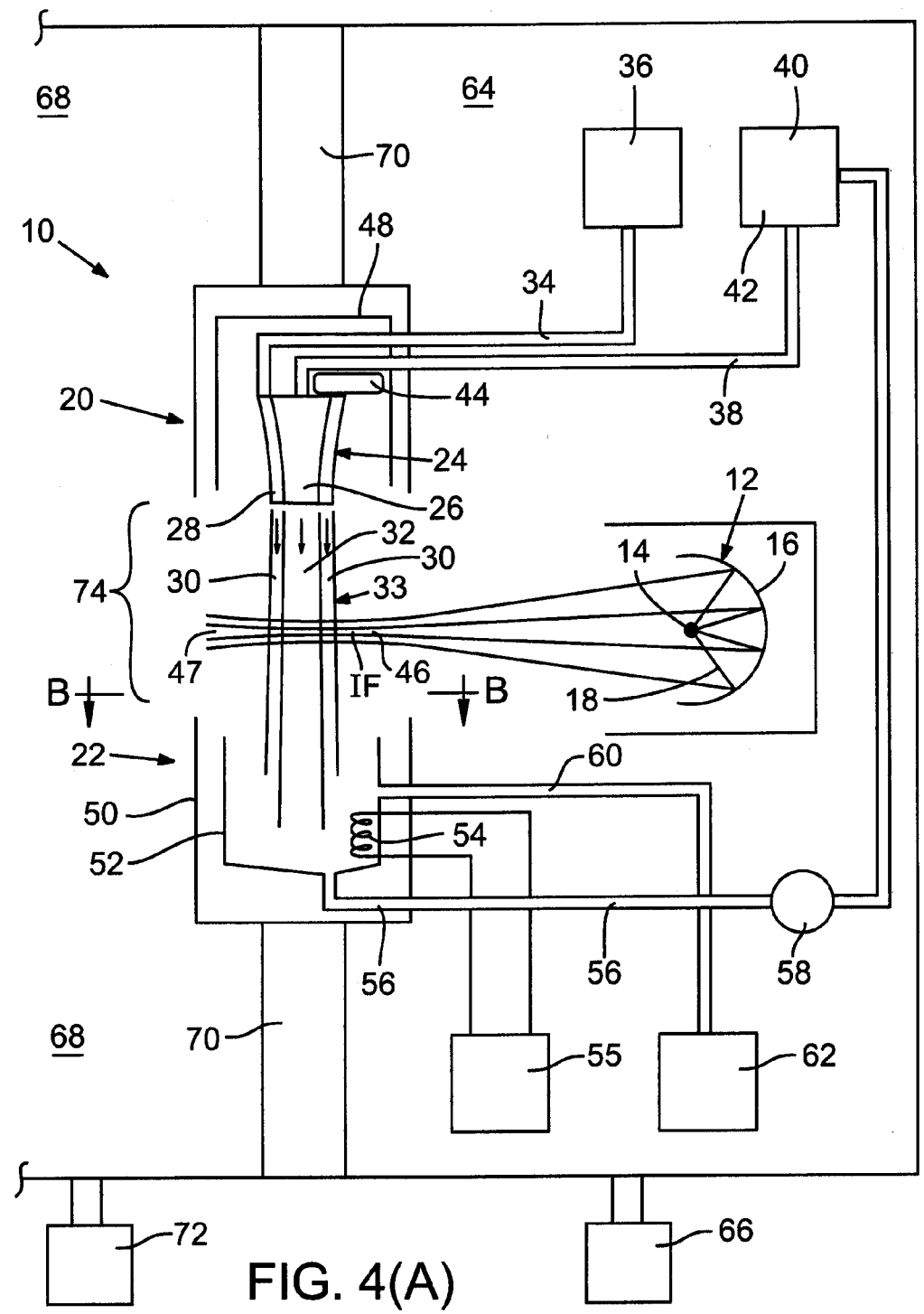
FIG. 4(A) is an elevational schematic view of a first representative embodiment of a gaseous SPF system.

A first representative embodiment of a gaseous SPF apparatus 10 is depicted in FIG. 4(A). The apparatus 10 is situated relative to an EUV source 12 comprising a plasma zone 14 and a collector mirror 16. At the plasma zone 14 is produced a plasma by, for example, high-intensity laser irradiation of units of a suitable target material. The plasma produces a large wavelength range of electromagnetic radiation 18, including EUV radiation of various wavelengths, infrared (IR) radiation, ultraviolet (UV) radiation, and visible radiation. Much of this radiation 18 is reflected from the collector mirror 16 that facilitates convergence of the collected radiation at an intermediate focus IF. At or just downstream of the intermediate focus IF the collected radiation (beam 46) passes through an SPF stream 33 (comprising a stream of SPF gas 32 enveloped in a stream of sheath gas 30, as described below) supplied by the gaseous SPF apparatus 10. As the beam 46 passes through the SPF stream 33, various wavelengths in the beam are blocked by the SPF stream. The beam 47 that has passed through the SPF stream 33 is enriched in the desired EUV wavelength(s).

The gaseous SPF apparatus 10 comprises a gas-discharge portion 20 and a gas-collection portion 22. The gas-discharge portion 20 comprises a nozzle assembly 24 that, in this embodiment, comprises an SPF-gas-discharge nozzle 26 and a sheath-gas-discharge nozzle 28. The sheath-gas-discharge nozzle 28 is configured (e.g., surrounds the SPF-gas-discharge nozzle 26) so that the sheath gas 30 discharged from the nozzle assembly 24 envelopes the stream of SPF gas 32 discharged from the nozzle assembly 24. The sheath gas 30 is supplied to the sheath-gas-discharge nozzle 28 via a conduit 34 from a sheath-gas supply 36. As noted above, the sheath gas desirably is non-reactive and substantially transparent to EUV of the desired wavelength(s). The SPF gas 32 is supplied to the SPF-gas-discharge nozzle 26 via a conduit 38 from an SPF-gas supply 40. The SPF-gas supply 40 is configured to hold a supply of SPF-gas liquid 42. If the vapor pressure of the SPF-gas liquid 42 is higher than desired at ambient temperature, the SPF-gas liquid 42 can be stored under cryogenic conditions. Just before the SPF-gas liquid 42, flowing through the conduit 38 from the SPF-gas supply 40, reaches the SPF-gas-discharge nozzle 26, it passes by a heater 44 that warms the liquid in the conduit 38 sufficiently to convert the liquid to SPF gas 32. If the particular SPF gas 32 is of a type that can be stored as a gas, then the supply 40 can be configured to contain the SPF gas in gaseous form, which would allow the heater 44 to be omitted. The SPF gas 32 is conducted to the nozzle 26 and discharged.

Figure 4B:
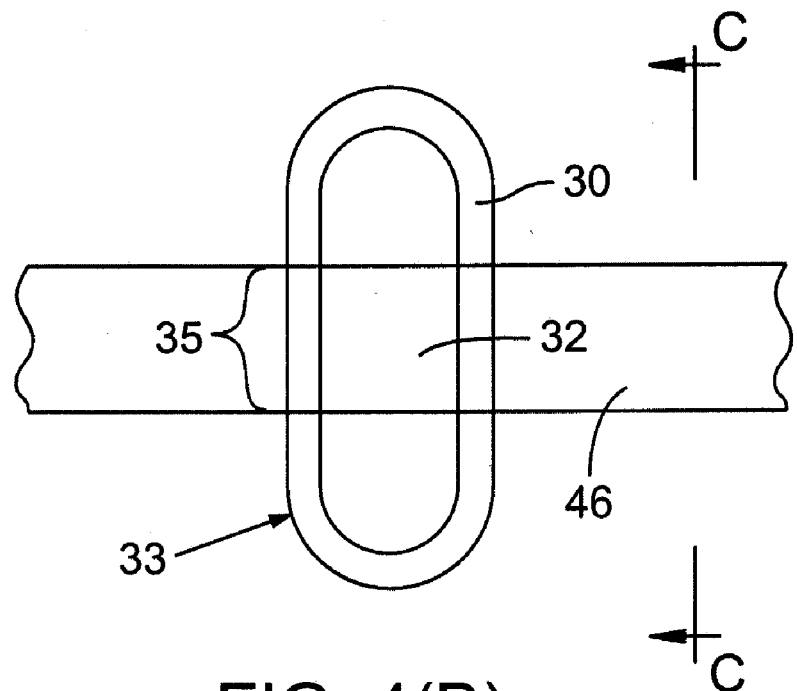
FIG. 4(B) depicts a transverse profile of the SPF stream.
Figure 4C:
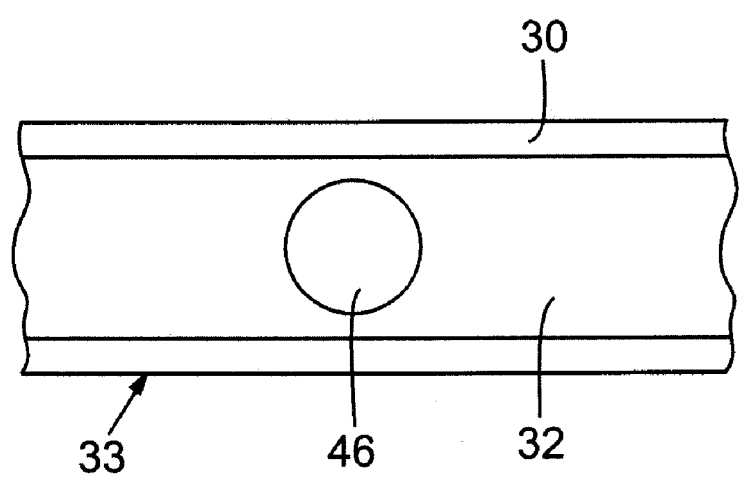
FIG. 4(C) depicts a transverse profile of the radiation beam.

FIG. 4(B) depicts a transverse profile of the SPF stream 33 formed by the discharged stream of SPF gas 32 enveloped by the discharged stream of sheath gas 30. Also depicted is the beam 46 of radiation from the collector mirror 18 (not shown, but situated to the right). FIG. 4(C) depicts a transverse profile of the radiation beam 46 relative to the SPF stream 33. By way of example, the radiation beam 46 has a diameter of 1-2 cm at the intermediate focus IF, and the transverse profile of the beam normally is round. The diameter of the radiation beam 46 at the SPF stream 33 is less than the width of the SPF-gas stream so as to impinge on an approximately planar region 35 of the SPF stream.

Returning to FIG. 4(A), the gas-discharge portion 20 in this embodiment is contained in a housing 48. Similarly, the gas-collection portion 22 is contained in a housing 50. The housings 48, 50 are open on at least one respective side to allow the gas streams 30, 32 to pass unobstructed from the gas-discharge portion 20 to the gas-collection portion 22.

The gas-collection portion 22 includes a collector 52 situated and configured to receive the gas streams 30, 32. In this embodiment, the collector 52 comprises a heat-exchanger 54, connected to a refrigeration unit 55, that chills the collected gas sufficiently to convert the collected SPF gas 32 to a liquid that is withdrawn from the housing 50 via a conduit 56 and a pump 58 that returns the liquid 42 to the SPF-gas supply 40. Collected sheath gas 30 can be scavenged from the collector 52 via a conduit 60 and vacuum pump 62. The gas pressure is monitored by sensors (not shown). A controller (not shown) monitors the sensors in order to adjust the SPF-gas supply 40, and thus the gas pressure, in a desired manner.

The EUV source 12 is contained in a source chamber 64 evacuated to a desired vacuum level by a vacuum pump 66. The source chamber 64 is separated from a downstream chamber 68 (illumination-optics chamber) by a wall 70 in or on which the gaseous SPF apparatus 10 is mounted. The chamber 68 is evacuated to a desired vacuum level by a vacuum pump 72. The SPF stream 33, as discharged from the nozzle assembly 24, traverses a window 74 defined in the wall 70. It is at the window 74 that the SPF stream 33 functions as an SPF.

The SPF gas 32 and sheath gas 30 desirably are discharged from their respective nozzles 26, 28 supersonically. Supersonic flow of these gases minimizes transverse spreading of the SPF stream 33, which maintains a "tight" stream of gas from the nozzle assembly 24, across the window 74, and to the collector 52 (especially in the low-pressure environment of the chambers 64, 68). The tight stream makes these gases easier to collect in the gas-collection portion 22 and improves background vacuum levels in the chambers 64, 68.

Figure 5:
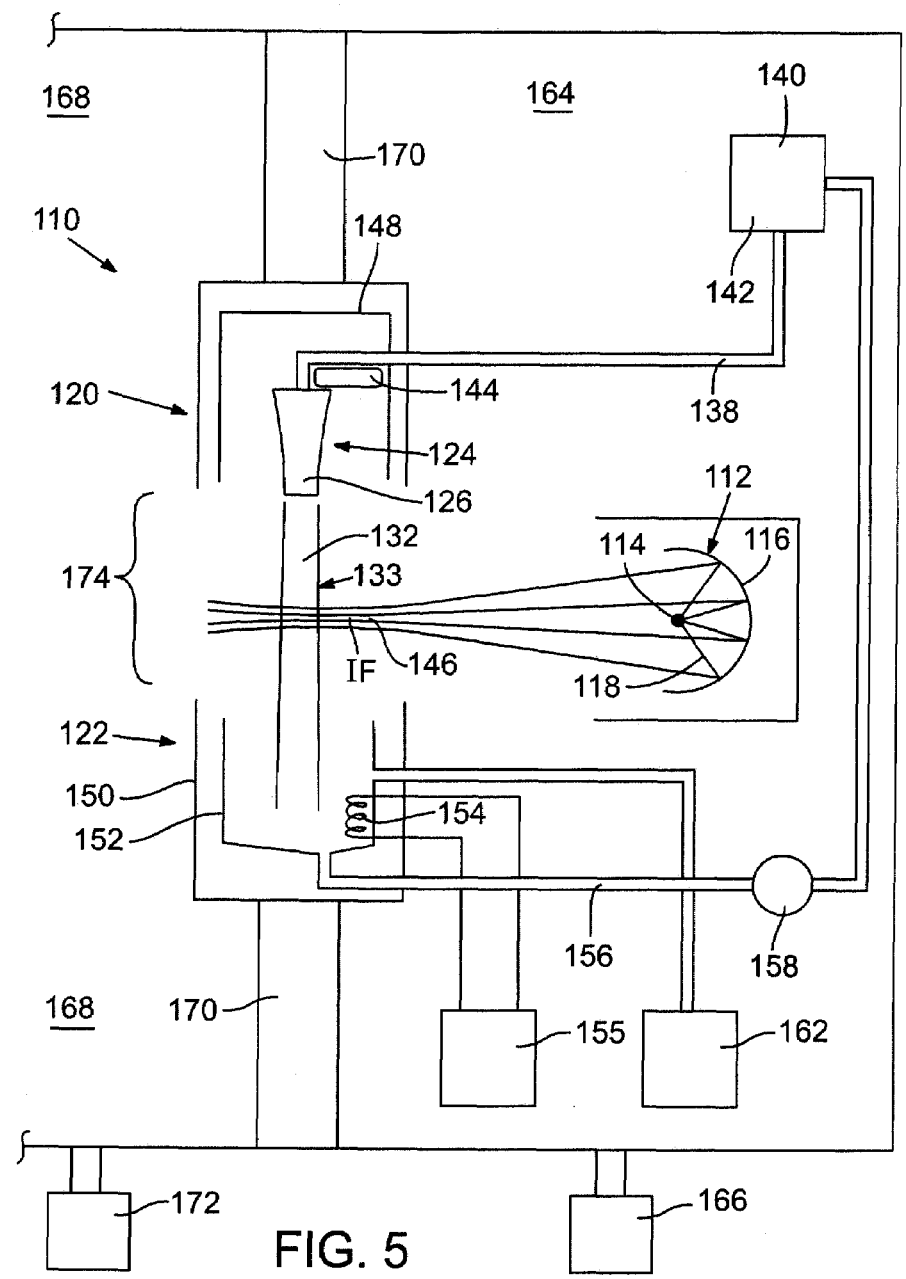
FIG. 5 is an elevational schematic view of a second representative embodiment of a gaseous SPF system.

A second representative embodiment of the gaseous SPF apparatus, illustrated in FIG. 5, is similar to the embodiment shown in FIG. 4(A), except that no sheath gas is used. The apparatus 110 is situated relative to an EUV source 112 comprising a plasma zone 114 and a collector mirror 116 that are similar to corresponding components 12, 14, 16 in the first representative embodiment. The plasma at the plasma zone 114 produces various wavelengths of electromagnetic radiation 118. Much of this radiation 118 is reflected from the collector mirror 116 to the intermediate focus IF. From the intermediate focus IF the collected radiation passes through an SPF stream 133 (consisting of a stream of SPF gas 132) supplied by the gaseous SPF apparatus 110.

The gaseous SPF apparatus 110 comprises a gas-discharge portion 120 and a gas-collection portion 122. The gas-discharge portion 120 comprises a nozzle assembly 124 that, in this embodiment comprises an SPF-gas-discharge nozzle 126. The SPF gas 132 is supplied to the SPF-gas-discharge nozzle 126 via a conduit 138 from an SPF-gas supply 140. The supply 140 is configured to hold a supply of SPF-gas liquid 142. Just before the SPF-gas liquid 142, flowing through the conduit 138 from the supply 140, reaches the SPF-gas-discharge nozzle 126, it passes by a heater 144 that warms the liquid in the conduit 138 sufficiently to convert the liquid to SPF gas 132. As noted above, if the SPF gas 132 is both stored and used as a gas, then the supply 140 would be of SPF gas in gaseous form and the heater 144 would not be required. The SPF gas 132 is conducted to the nozzle 126 and discharged. The gas pressure is monitored by sensors (not shown). A controller (not shown) monitors the sensors in order to adjust the SPF-gas supply 140, and thus the gas pressure, in a desired manner.

The gas-discharge portion 120 in this embodiment is contained in a housing 148. Similarly, the gas-collection portion 122 is contained in a housing 150. The housings 148, 150 are open on at least one respective side to allow the SPF stream 133 to pass unobstructed from the gas-discharge portion 120, across the window 174, and to the gas-collection portion 122.

The gas-collection portion 122 includes a collector 152 situated and configured to receive the SPF stream 133. In this embodiment, the collector 152 comprises a heat-exchanger 154, connected to a refrigeration unit 155 that chills the collected SPF gas sufficiently to convert it to a liquid that is withdrawn from the housing 150 via a conduit 156 and a pump 158 that returns the liquid 142 to the SPF-gas supply 140.

The EUV source 112 is contained in a source chamber 164 evacuated to a desired vacuum level by a vacuum pump 166. The source chamber 164 is separated from a downstream chamber 168 (illumination-optics chamber) by a wall 170 in or on which the gaseous SPF apparatus 110 is mounted. The chamber 168 is evacuated to a desired vacuum level by a vacuum pump 172. The SPF stream 133, as discharged from the nozzle assembly 124, traverses the window 174 defined in the wall 170.

The SPF gas 132 desirably is discharged from the nozzle 126 supersonically, which maintains a tight stream of gas from the nozzle assembly 124, across the window 174, and to the collector 152 (especially in the low-pressure environment of the chambers 164, 168). Supersonic flow also improves background vacuum levels in the chambers 164, 168, and makes the SPF gas 132 easier to collect in the gas-collection portion 122.

In an alternative embodiment, the gaseous SPF is not formed as a stream or curtain of gas in the manner described above. Rather, the SPF gas simply is supplied, at low pressure, to the chamber housing the EUV source. EUV light produced by the EUV source passes through the SPF gas as the EUV light exits the chamber. An exemplary SPF gas is $ZrCl_4$. If this or other halogen-containing gas is used, it is desirable that the surfaces, especially the reflective surfaces, of any mirrors (such as a collector mirror) in the chamber be coated with one or more "platinum group" elements to prevent halogen erosion of the mirror(s). For example, Cl produced in the chamber is erosive to mirrors.

EUVL Systems

Figure 6:
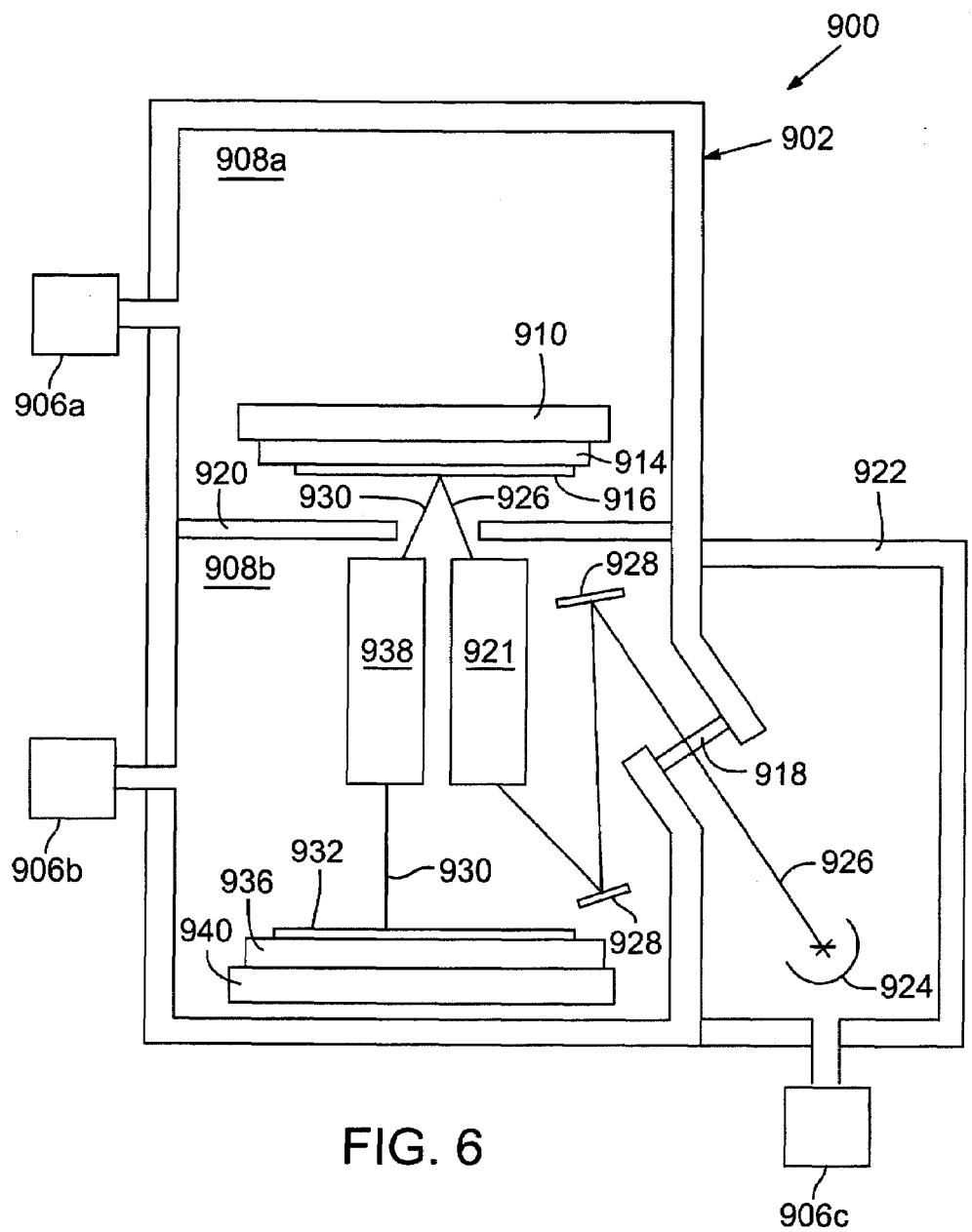
FIG. 6 is a schematic elevational view of an EUV lithography system including a gaseous SPF system as disclosed herein.

Referring now to FIG. 6, an embodiment of an EUVL system 900 is shown. The depicted system 900 comprises a vacuum chamber 902 including vacuum pumps 906a, 906b that are arranged to enable desired vacuum levels to be established and maintained within respective chambers 908a, 908b of the vacuum chamber 902. For example, the vacuum pump 906a maintains a vacuum level of approximately 50 mTorr in the upper chamber (reticle chamber) 908a, and the vacuum pump 906b maintains a vacuum level of less than approximately 1 mTorr in the lower chamber (optical chamber) 908b.

The two chambers 908a, 908b are separated from each other by a barrier wall 920. Various components of the EUVL system 900 are not shown, for ease of discussion, although it will be appreciated that the EUVL system 900 can include components such as a reaction frame, a vibration-isolation mechanism, various actuators, and various controllers.

An EUV reticle 916 is held by a reticle chuck 914 coupled to a reticle stage 910. The reticle stage 910 holds the reticle 916 and allows the reticle to be moved laterally in a scanning manner, for example, during use of the reticle for making lithographic exposures. An illumination source 924 is contained in a vacuum chamber 922 evacuated by a vacuum pump 906c. The illumination source 924 produces an EUV illumination beam 926 that is transmitted through a gaseous SPF 918, as described above, and enters the optical chamber 908b. The illumination beam 926 reflects from one or more mirrors 928 and through an illumination-optical system 921 to illuminate a desired location on the reticle 916. As the illumination beam 926 reflects from the reticle 916, the beam is "patterned" by the pattern portion actually being illuminated on the reticle. The barrier wall 920 defines an aperture 934 through which the illumination beam 926 illuminates the desired region of the reticle 916. The incident illumination beam 926 on the reticle 916 becomes patterned by interaction with pattern-defining elements on the reticle. The resulting patterned beam 930 propagates generally downward through a projection-optical system 938 onto the surface of a wafer 932 held by a wafer chuck 936 on a wafer stage 940 that performs scanning motions of the wafer during exposure. Hence, images of the reticle pattern are projected onto the wafer 932.

The wafer stage 940 can include (not detailed) a positioning stage that may be driven by a planar motor or one or more linear motors, for example, and a wafer table that is magnetically coupled to the positioning stage using an EI-core actuator, for example. The wafer chuck 936 is coupled to the wafer table, and may be levitated relative to the wafer table by one or more voice-coil motors, for example. If the positioning stage is driven by a planar motor, the planar motor typically utilizes respective electromagnetic forces generated by magnets and corresponding armature coils arranged in two dimensions. The positioning stage is configured to move in multiple degrees of freedom of motion, e.g., three to six degrees of freedom, to allow the wafer 932 to be positioned at a desired position and orientation relative to the projection-optical system 938 and the reticle 916.

Movements of the wafer stage 940 and the reticle stage 910 generate reaction forces that may adversely affect performance of the EUVL system 900. Reaction forces generated by motion of the wafer stage 940 may be released mechanically to the floor or ground via a frame member, as discussed in U.S. Pat. No. 5,528,118 and in Japan Kôkai Patent Document No. 8-166475. Reaction forces generated by motions of the reticle stage 910 may be mechanically released to the floor or ground by use of a frame member as described in U.S. Pat. No. 5,874,820 and Japan Kôkai Patent Document No. 8-330224, all of which being incorporated herein by reference in their respective entireties.

An EUVL system including the above-described EUV-source and illumination-optical system can be constructed by assembling various assemblies and subsystems in a manner ensuring that prescribed standards of mechanical accuracy, electrical accuracy, and optical accuracy are met and maintained. To establish these standards before, during, and after assembly, various subsystems (especially the illumination-optical system and projection-optical system) are assessed and adjusted as required to achieve the specified accuracy standards. Similar assessments and adjustments are performed as required of the mechanical and electrical subsystems and assemblies. Assembly of the various subsystems and assemblies includes the creation of optical and mechanical interfaces, electrical interconnections, and plumbing interconnections as required between assemblies and subsystems. After assembling the EUVL system, further assessments, calibrations, and adjustments are made as required to ensure attainment of specified system accuracy and precision of operation. To maintain certain standards of cleanliness and avoidance of contamination, the EUVL system (as well as certain subsystems and assemblies of the system) are assembled in a clean room or the like in which particulate contamination, temperature, and humidity are controlled.

Figure 7:
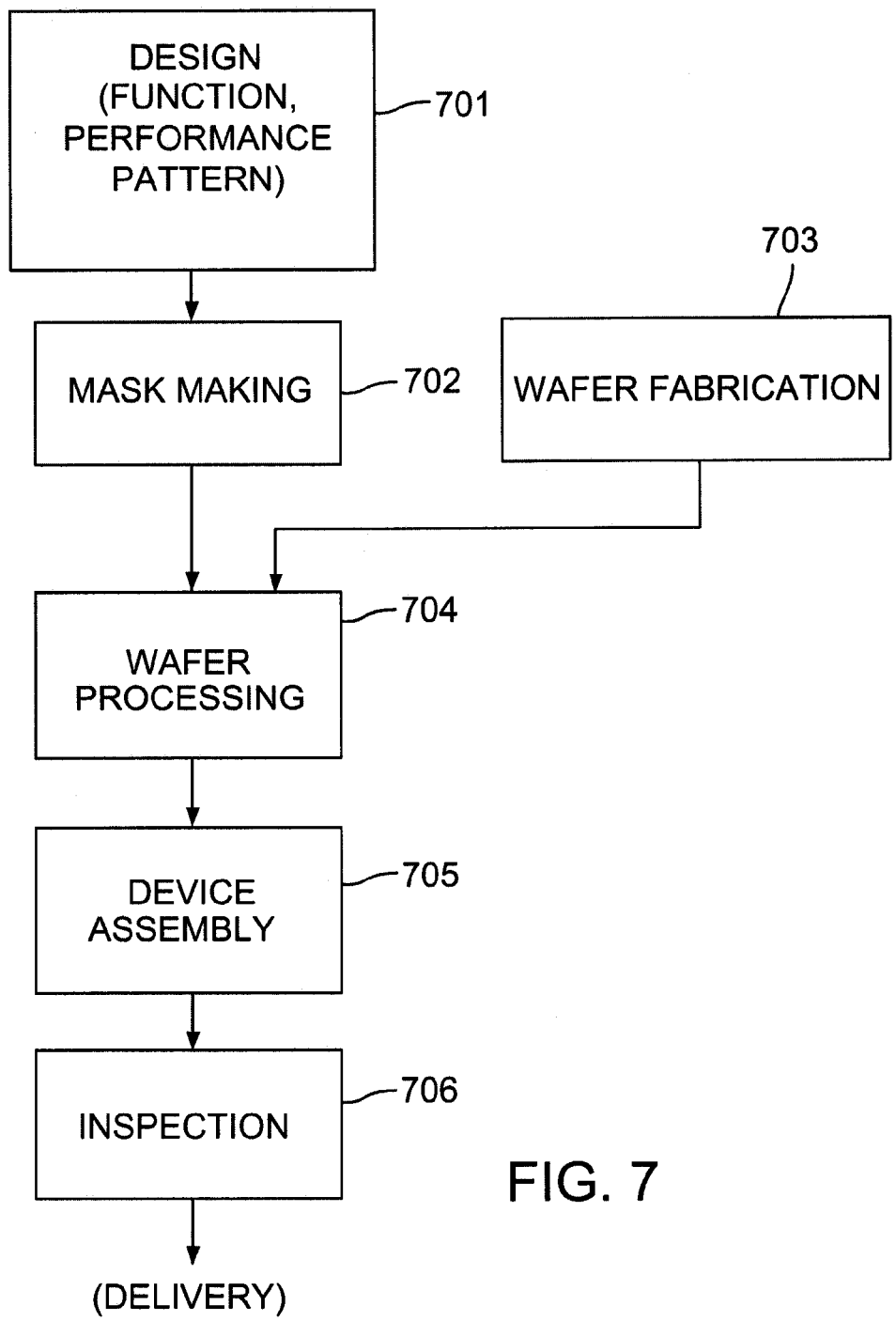
FIG. 7 is a process-flow diagram illustrating exemplary steps associated with a process for fabricating semiconductor devices.

Semiconductor devices can be fabricated by processes including microlithography steps performed using a microlithography system as described above. Referring to FIG. 7, in step 701 the function and performance characteristics of the semiconductor device are designed. In step 702 a reticle defining the desired pattern is designed according to the previous design step. Meanwhile, in step 703, a substrate (wafer) is made and coated with a suitable resist. In step 704 the reticle pattern designed in step 702 is exposed onto the surface of the substrate using the microlithography system. In step 705 the semiconductor device is assembled (including "dicing" by which individual devices or "chips" are cut from the wafer, "bonding" by which wires are bonded to the particular locations on the chips, and "packaging" by which the devices are enclosed in appropriate packages for use). In step 706 the assembled devices are tested and inspected.

Figure 8:
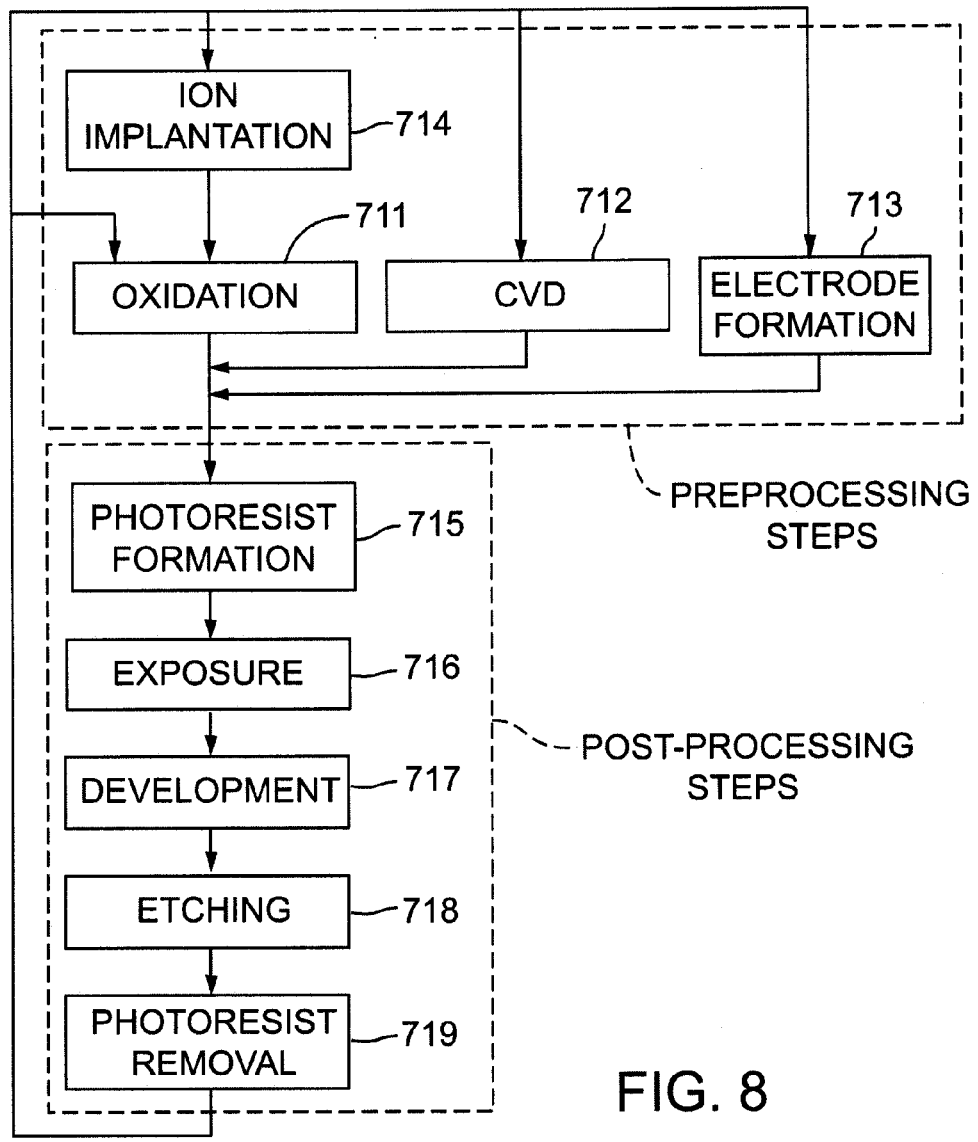
FIG. 8 is a process-flow diagram illustrating exemplary steps associated with processing a substrate (wafer), as would be performed, for example, in step 704 in FIG. 7.

Representative details of a wafer-processing process including a microlithography step are shown in FIG. 8. In step 711 (oxidation) the wafer surface is oxidized. In step 712 (CVD) an insulative layer is formed on the wafer surface. In step 713 (electrode formation) electrodes are formed on the wafer surface by vapor deposition for example. In step 714 (ion implantation) ions are implanted in the wafer surface. These steps 711-714 constitute representative "pre-processing" steps for wafers, and selections are made at each step according to processing requirements.

At each stage of wafer processing, when the pre-processing steps have been completed, the following "post-processing" steps are implemented. A first post-process step is step 715 (photoresist formation) in which a suitable resist is applied to the surface of the wafer. Next, in step 716 (exposure), the microlithography system described above is used for lithographically transferring a pattern from the reticle to the resist layer on the wafer. In step 717 (development) the exposed resist on the wafer is developed to form a usable mask pattern, corresponding to the resist pattern, in the resist on the wafer. In step 718 (etching), regions not covered by developed resist (i.e., exposed material surfaces) are etched away to a controlled depth. In step 719 (photoresist removal), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

It will be apparent to persons of ordinary skill in the relevant art that various modifications and variations can be made in the system configurations described above, in materials, and in construction without departing from the spirit and scope of this disclosure.

I claim:

1. In a system that receives a beam of light from a source and delivers the beam to a downstream optical system, a gaseous spectral-purity filter (SPF) through which the beam from the source passes as the beam propagates to the optical system, the gaseous SPF being formulated and configured to enrich the beam in at least one desired wavelength as the beam passes through the gaseous SPF;

the source and optical system being situated in a subatmospheric-pressure environment;

the gaseous SPF being configured as a stream of SPF gas flowing in the subatmospheric-pressure environment; and the gaseous SPF further comprising a stream of sheath gas enveloping the stream of SPF gas such that the beam passes through both streams as the beam passes through the gaseous SPF.

2. In a system that receives a beam of EUV-containing light from a source and delivers the beam to a downstream EUV-optical system, a gaseous spectral-purity filter (SPF) through which the beam from the source passes as the beam propagates to the optical system, the gaseous SPF being formulated and configured to enrich the beam in at least one desired EUV wavelength as the beam passes through the gaseous SPF; and the gaseous SPF comprising a first gas-discharge device and a stream of SPF gas discharged from the first gas-discharge device, the stream of SPE gas comprising $ZrCl_4$ gas, $B_5H_{11}$ gas, or a mixture thereof.

3. The gaseous SPE of claim 2, wherein:

the SPF gas is $ZrCl_4$;

the first gas-discharge device is connected to a source of $ZrCl_4$ liquid; and the first gas-discharge device comprises means for converting the $ZrCl_4$ liquid to a gas before the gas is discharged from the first gas-discharge device.

4. The gaseous SPF of claim 2, further comprising:

a second gas-discharge device situated relative to the first gas-discharge device; and a stream of sheath gas discharged from the second gas-discharge device so as to envelop the stream of SPF gas.

5. The gaseous SPF of claim 4, wherein the stream of sheath gas comprises an inert gas that is transmissive to the desired EUV wavelength.

6. The gaseous SPF of claim 2, wherein the stream of SPF gas is a supersonic stream in a subatmospheric-pressure environment.

7. The gaseous SPF of claim 2, comprising a gas-discharge assembly comprising a first gas-discharge device connected to a supply of an SPF gas and configured to discharge a stream of the SPF gas such that the beam is incident on the stream in a manner allowing at least a portion of the beam to pass through the stream.

8. The gaseous SPF of claim 7, further comprising a gas-collection assembly situated relative to the gas-discharge assembly and the beam, the gas-collection assembly being configured to collect the SPF gas from the stream through which the beam has passed.

9. The gaseous SPF of claim 7, wherein:

the gas-discharge assembly further comprises a second gas-discharge device connected to a supply of a sheath gas comprising an inert gas that is transmissive to the desired EUV wavelength; and the second gas-discharge device is configured to discharge a stream of the sheath gas that envelops the stream of SPF gas.

10. The gaseous SPF of claim 9, further comprising a gas-collection assembly situated relative to the gas-discharge assembly and the beam, and configured to collect the SPF gas and the sheath gas from the stream through which the beam has passed.

11. The gaseous SPF of claim 9, wherein:
the first gas-discharge device comprises a first nozzle; and
the second gas-discharge device comprises a second nozzle in surrounding relationship to the first nozzle.

12. An EUV optical system, comprising:
an optical system situated and configured to receive a beam of EUV light from a source; and
a gaseous spectral-purity filter (SPF) situated between the source and the optical system, or within the optical system, such that the beam passes through the SPF as the beam propagates from the source through the optical system, the gaseous SPF serving to enrich the beam, downstream of the SPF compared to upstream of the SPF, in a desired EUV wavelength as the beam passes through the gaseous SPF;
the gaseous SPF comprising a first gas-discharge means, a stream of SPF gas discharged from the first gas-discharge means, a second gas-discharge means situated relative to the first gas-discharge means, and a stream of sheath gas discharged from the second gas-discharge means so as to envelop the stream of SPF gas.

13. The EUV optical system of claim 12, wherein the gaseous SPF further comprises a gas-discharge portion connected to a supply of an SPF gas and configured to discharge a stream of the SPF gas such that the beam from the source is incident on the stream in a manner allowing the beam to pass through the stream to the optical system.

14. The EUV optical system of claim 13, wherein the gaseous SPF further comprises a gas-collection portion situated relative to the gas-discharge portion and the beam, and configured to collect the SPF gas from the stream through which the beam has passed.

15. The EUV optical system of claim 13, wherein:
the gas-discharge portion comprises a first nozzle connected to the supply of SPF gas and configured to discharge the stream of SPF gas;
the gas-discharge portion further comprises a second nozzle surrounding the first nozzle, the second nozzle being connected to a supply of a sheath gas; and
the second nozzle is configured to discharge a stream of the sheath gas that envelops the stream of SPF gas through which the beam passes.

16. The EUV optical system of claim 15, wherein the gaseous SPF further comprises a gas-collection portion situated relative to the gas-discharge portion and the beam, and configured to collect the SPF gas and the sheath gas from the stream through which the beam has passed.

17. An EUV optical system, comprising:
an optical system situated and configured to receive a beam of EUV light from a source; and
a first spectral-purity filter (SPF) situated between the source and the optical system, or within the optical system, the first SPF being a gaseous SPF; and
a second SPF situated downstream of the first SPF,
wherein the beam passes through the first and second SPFs as the beam propagates from the source through the optical system, the first and second SPFs serving to enrich the beam, downstream of the SPEs compared to upstream of the SPFs, in a desired EUV wavelength as the beam passes through the first and second SPFs.

18. The EUV optical system of claim 17, wherein the second SPF comprises a film of Zr.

19. A gaseous spectral-purity-filter (SPF) apparatus for placement between an EUV source and an optical element, the apparatus comprising:
a gas-discharge portion situated and configured to release a stream of SPF gas into a propagation pathway of a beam of EUV light from the EUV source, such that the beam from the EUV source passes through the stream of SPF gas to the optical element, the SPF gas being transmissive for a desired wavelength of EUV light in the beam while blocking at least some other wavelengths in the beam; and
a gas-collection portion situated relative to the gas-discharge portion and configured to collect the SPF gas from the stream after the beam has passed through the stream of SPF gas;
the gas-discharge portion comprising a nozzle assembly from which the stream of SPF gas is discharged, and the nozzle assembly comprising an SPF-gas-discharge nozzle and a sheath-gas-discharge nozzle, the sheath-gas-discharge nozzle being configured to release a stream of sheath gas as the SPF-gas-discharge nozzle releases the stream of SPF gas.

20. The apparatus of claim 19, wherein the sheath-gas-discharge nozzle surrounds the SPF-gas-discharge nozzle such that the released stream of SPF gas is enveloped in the stream of sheath gas.

21. The apparatus of claim 19, wherein the SPF gas is $ZrCl_4$ or $B_5H_{11}$ or a mixture thereof.

22. An illumination-optical system for EUV lithography, comprising:
an EUV source situated and configured to produce a beam of EUV-containing light;
a first EUV-reflective optical element situated downstream of the EUV source; and
a gaseous spectral-purity filter (SPF) situated between the EUV source and the first EUV-reflective optical element, the gaseous SPF being configured to produce a stream of SPF gas through which the beam from the EUV source passes as the beam propagates to the first EUV-reflective optical element, the gaseous SPF being formulated and configured to enrich the beam in at least one desired EUV wavelength as the beam passes through the SPF.

23. The illumination-optical system of claim 22, further comprising a second EUV-reflective optical element situated between the EUV source and the first EUV-reflective optical element.

24. An EUV lithography system, comprising:
an illumination-optical system situated and configured to receive a beam of EUV light from a source and to direct the beam for lithographic imaging; and
a gaseous spectral-purity filter (SPF) situated between the source and the illumination-optical system or within the illumination-optical system, the gaseous SPF being configured to produce a stream of SPF gas through which the beam passes and being formulated and configured to enrich the beam in at least one desired EUV wavelength as the beam passes through the SPF;
the gaseous SPF comprising a first gas-discharge device and a stream of SPF gas discharged from the first gas-discharge device, the stream of SPF gas comprising $ZrCl_4$ gas, $B_5H_{11}$ gas, or a mixture thereof; and
the gaseous SPF further comprising a second gas-discharge device situated relative to the first gas-discharge device and a stream of sheath gas discharged from the second gas-discharge device so as to envelop the stream of SPF gas.

25. A source of EUV light, comprising:

a generating device that generates EUV-containing light; and a gaseous spectral-purity filter (SPF) situated downstream of the generating device, the gaseous SPF being configured to produce a stream of SPF gas through which the EUV-containing light passes as the EUV-containing light propagates downstream of the generating device, the gaseous SPF being formulated and configured to enrich the EUV-containing light in at least one desired EUV wavelength as said light passes through the SPF;

the gaseous SPF comprising a first gas-discharge device and a stream of SPF gas discharged from the first gas-discharge device, the stream of SPF gas comprising $ZrCl_4$ gas, $B_5H_{11}$ gas, or a mixture thereof; and the gaseous SPF further comprising a second gas-discharge device situated relative to the first gas-discharge device, and a stream of sheath gas discharged from the second gas-discharge device so as to envelop the stream of SPF gas.

26. The source of claim 25, further comprising a collector situated relative to the generating device and configured to collect at least some of the EUV-containing light into a beam that is directed by the collector to the stream of SPF gas.

27. The source of claim 25, wherein the generating device is a laser-plasma source or a discharge-plasma source.

28. A method for producing a beam of EUV light that is enriched with respect to a desired wavelength of EUV radiation, comprising:

producing a beam of electromagnetic radiation comprising EUV light;

discharging a stream of spectral-purity-filter (SPF) gas and a stream of sheath gas enveloping the stream of SPF gas, the SPF gas being transmissive to a desired wavelength of EUV radiation and non-transmissive to an undesired wavelength of electromagnetic radiation, the stream of SPF gas comprising $ZrCl_4$ gas, $B_5H_{11}$ gas, or a mixture thereof; and passing the beam through the enveloped stream of SPF gas.

29. In a microelectronic-device manufacturing process, a microlithography step performed using the EUV lithography system recited in claim 24.

30. A microelectronic device fabricated using a process as recited in claim 29.

* * * * *

UNITED STATES PATENT AND TRADEMARK OFFICE
CERTIFICATE OF CORRECTION

PATENT NO. : 7,598,508 B2  Page 1 of 1
APPLICATION NO. : 11/339119
DATED : October 6, 2009
INVENTOR(S) : Michael R. Sogard It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 671 days.

Signed and Sealed this

Twenty-eighth Day of September, 2010

David J. Kappos
*Director of the United States Patent and Trademark Office*